United States Patent
Choi et al.

(10) Patent No.: US 9,147,627 B2
(45) Date of Patent: Sep. 29, 2015

(54) FLIP CHIP MLP WITH CONDUCTIVE INK

(75) Inventors: Seung-Yong Choi, Seoul (KR); Ti Ching Shian, Georgetown (MY); Maria Cristina B. Estacio, Relau (MY)

(73) Assignee: Fairchild Semiconductor Corporation, San Jose, CA (US)

( * ) Notice: Subject to any disclaimer, the term of this patent is extended or adjusted under 35 U.S.C. 154(b) by 1047 days.

(21) Appl. No.: 12/616,943

(22) Filed: Nov. 12, 2009

(65) Prior Publication Data

US 2010/0052127 A1    Mar. 4, 2010

Related U.S. Application Data

(63) Continuation of application No. 11/364,014, filed on Feb. 28, 2006, now Pat. No. 7,638,861.

(60) Provisional application No. 60/748,435, filed on Dec. 8, 2005, provisional application No. 60/756,452, filed on Jan. 5, 2006.

(51) Int. Cl.
| | |
|---|---|
| *H01L 23/02* | (2006.01) |
| *H01L 23/31* | (2006.01) |
| *H01L 21/56* | (2006.01) |
| *H01L 23/498* | (2006.01) |
| *H01L 23/00* | (2006.01) |

(52) U.S. Cl.
CPC ......... *H01L 23/3107* (2013.01); *H01L 21/565* (2013.01); *H01L 23/4985* (2013.01); *H01L 24/83* (2013.01); *H01L 24/90* (2013.01); *H01L 24/16* (2013.01); *H01L 2224/1134* (2013.01); *H01L 2224/11822* (2013.01); *H01L 2224/1308* (2013.01); *H01L 2224/13144* (2013.01); *H01L 2224/13147* (2013.01); *H01L 2224/16225* (2013.01); *H01L 2224/2919* (2013.01); *H01L 2224/838* (2013.01); *H01L 2224/83191* (2013.01); *H01L 2224/83194* (2013.01); *H01L 2224/83907* (2013.01); *H01L 2924/00013* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01061* (2013.01); *H01L 2924/01079* (2013.01); *H01L 2924/01082* (2013.01); *H01L 2924/0665* (2013.01); *H01L 2924/1301* (2013.01); *H01L 2924/13055* (2013.01); *H01L 2924/14* (2013.01)

(58) Field of Classification Search
None
See application file for complete search history.

(56) References Cited

U.S. PATENT DOCUMENTS

| | | | |
|---|---|---|---|
| 5,332,864 | A | 7/1994 | Liang et al. |
| 5,559,316 | A | 9/1996 | Tomoda |
| 5,644,164 | A | 7/1997 | Roh |
| 6,153,924 | A | 11/2000 | Kinsman |
| 6,339,255 | B1 * | 1/2002 | Shin ............................ 257/686 |
| 6,384,472 | B1 * | 5/2002 | Huang ......................... 257/680 |
| 6,465,279 | B2 | 10/2002 | Ohsawa et al. |
| 6,475,827 | B1 | 11/2002 | Lee |
| 6,492,737 | B1 | 12/2002 | Imasu et al. |
| 6,661,084 | B1 | 12/2003 | Peterson et al. |
| 6,781,243 | B1 | 8/2004 | Li et al. |
| 7,112,871 | B2 | 9/2006 | Shiu |
| 2002/0020923 | A1 | 2/2002 | Kanatake |
| 2005/0133896 | A1 | 6/2005 | Liu et al. |

* cited by examiner

*Primary Examiner* — Benjamin Sandvik
(74) *Attorney, Agent, or Firm* — Christensen O'Connor Johnson Kindness PLLC

(57) ABSTRACT

A flip chip molded leadless package (MLP) with electrical paths printed in conducting ink. The MLP includes a premolded leadframe with the electrical paths printed directly thereon. The present invention also provides a method of fabricating the semiconductor package.

8 Claims, 11 Drawing Sheets

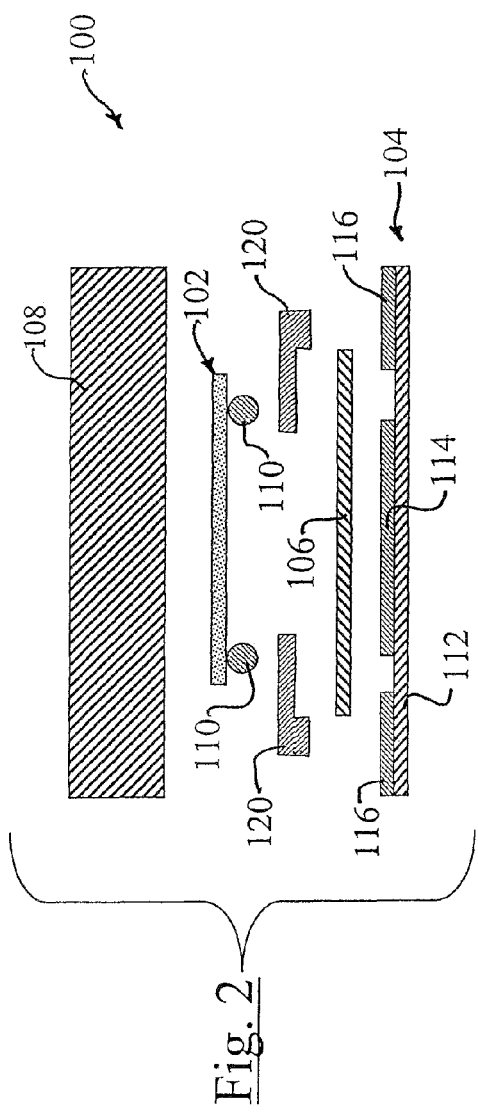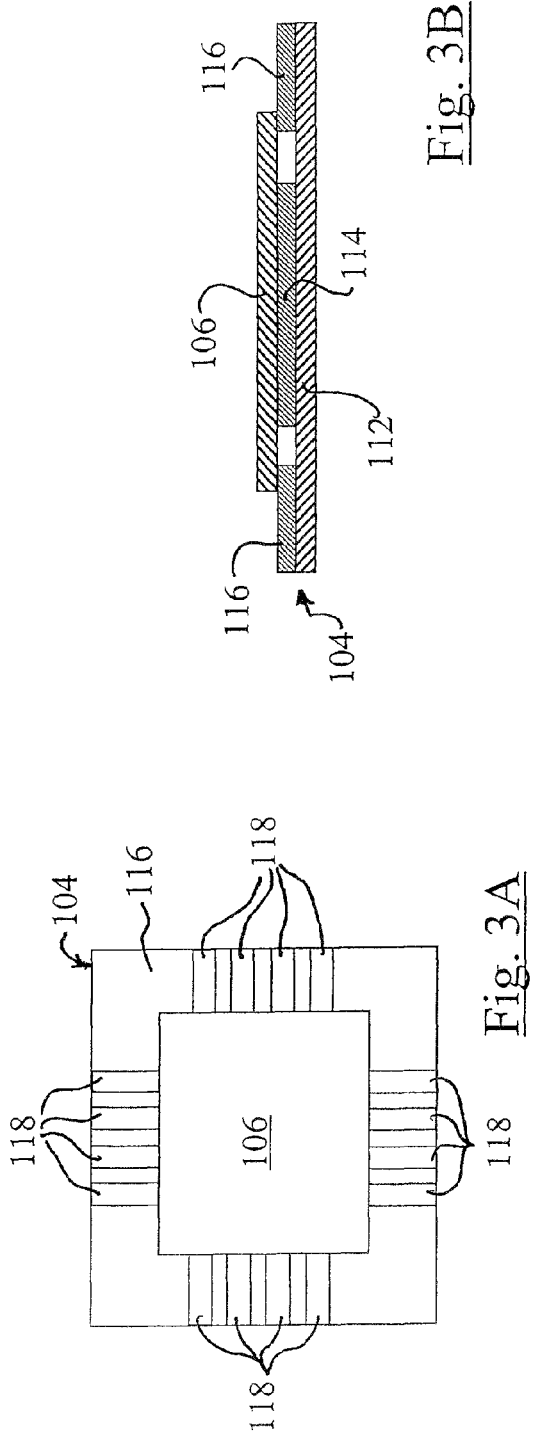

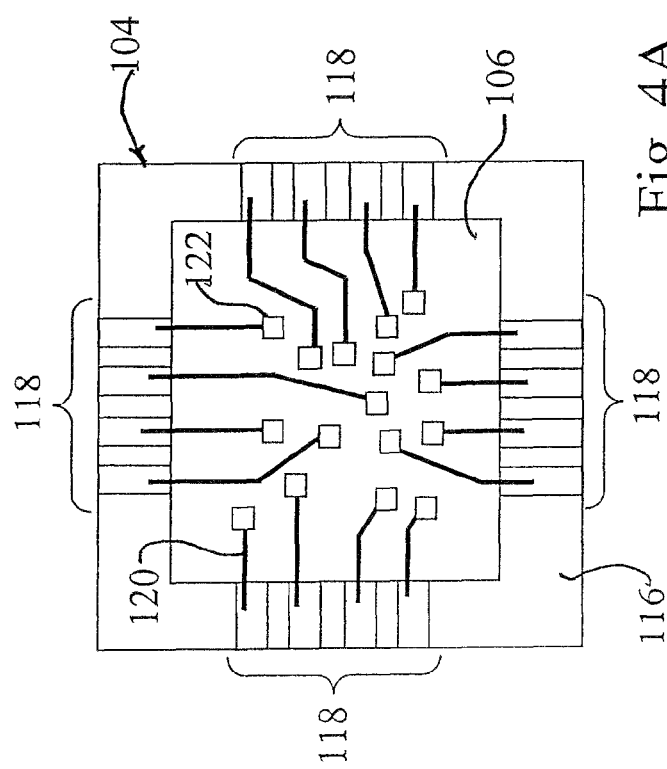
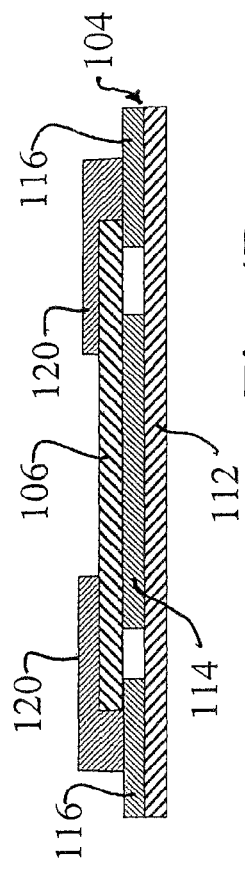

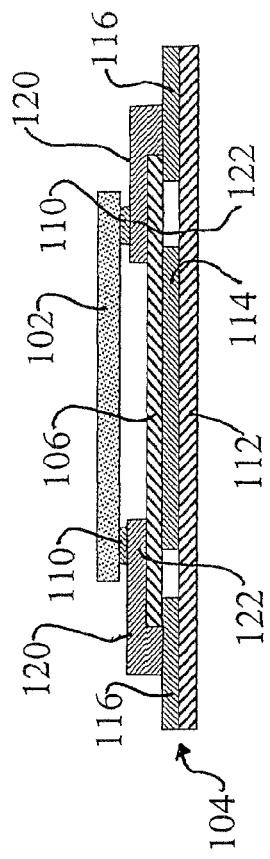
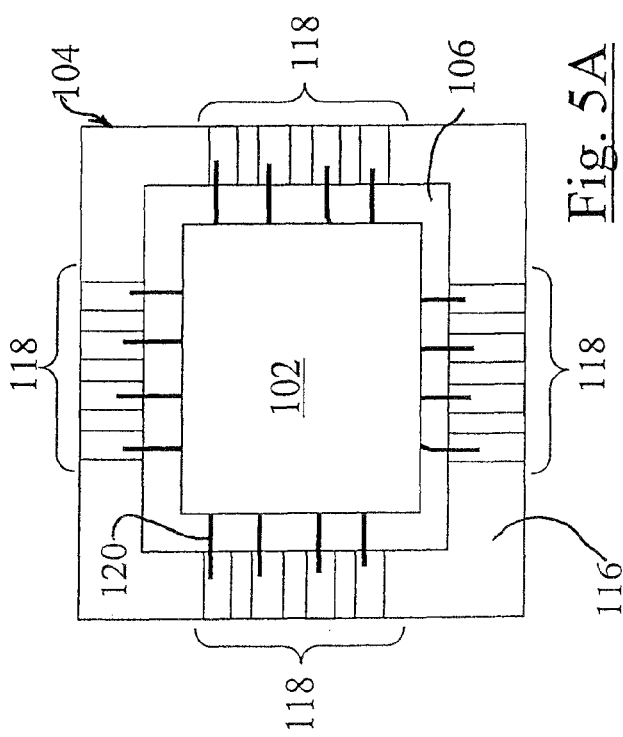

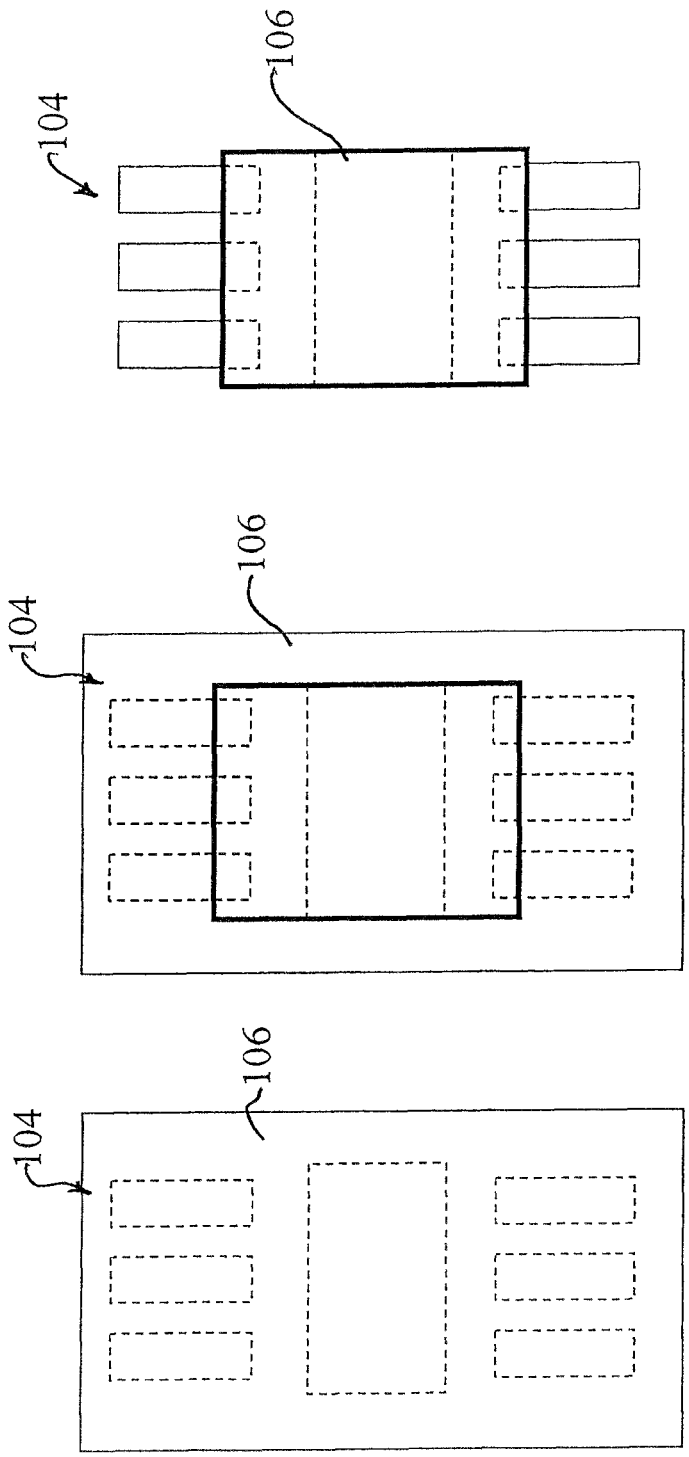

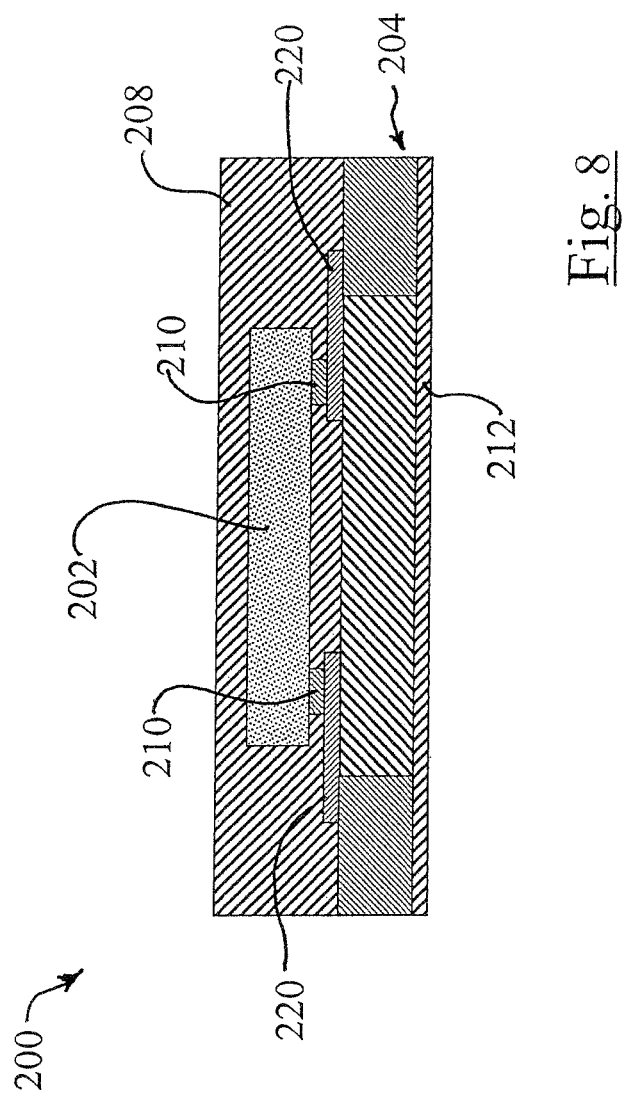

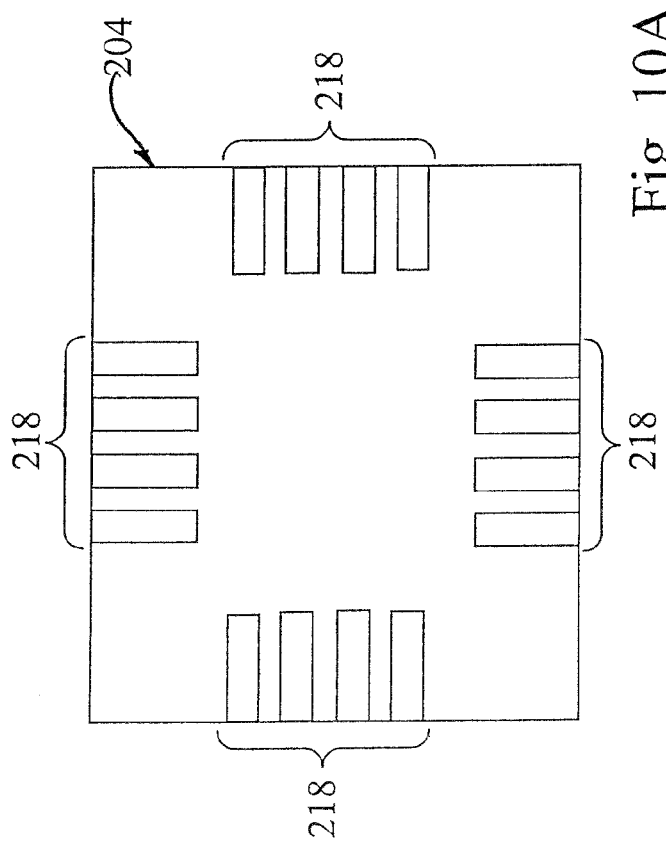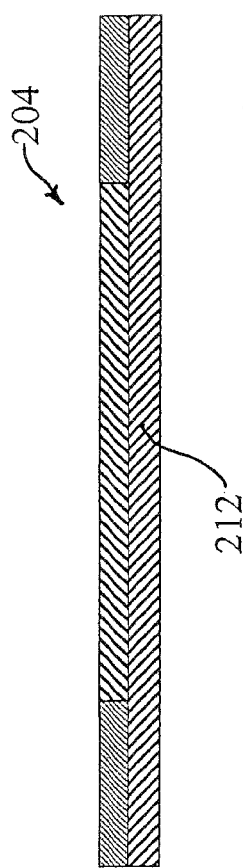

FLIP CHIP MLP WITH CONDUCTIVE INK

CROSS-REFERENCE TO RELATED APPLICATIONS

This application is continuation of U.S. patent application Ser. No. 11/364,014 filed Feb. 28, 2006, and claims priority from U.S. Provisional Patent Application Ser. No. 60/748,435, filed Dec. 8, 2005 and U.S. Provisional Patent Application Ser. No. 60/756,452 filed Jan. 5, 2006.

FIELD OF THE INVENTION

This invention relates to a semiconductor device, and more particularly, to a semiconductor package for protecting a semiconductor chip and connecting the semiconductor chip with an external device.

BACKGROUND OF THE INVENTION

It is conventional in the electronic industry to encapsulate one or more semiconductor devices, such as integrated circuit dies, or chips, in a semiconductor package. These plastic packages protect a chip from environmental hazards, and provide an apparatus for electrically and mechanically attaching the chip to an intended device. Such semiconductor packages have included metal lead frames for supporting an integrated circuit chip which is bonded to a chip paddle region formed centrally therein. Bond wires that electrically connect pads on the integrated circuit chip to individual leads of the lead frame are then incorporated. A hard plastic encapsulating material that covers the bond wire, the integrated circuit chip, and other components forms the exterior of the package.

As the integration density of semiconductor chips increases, the number of pads of each semiconductor chip increases. However, semiconductor packages are being continuously demanded to be smaller and lighter with an increasing demand for portable semiconductor products. Further, reductions in cost and increases in reliability in the manufacturing of the packages are demanded.

According to such miniaturization tendencies, semiconductor packages, which transmit electrical signals from semiconductor chips to motherboards and support the semiconductor chips on the motherboards, have been designed to have a small size. Examples of such semiconductor packages are referred to as MLP (molded leadless package) type semiconductor packages. During the manufacturing for a semiconductor package, electrical testing is required to insure proper function of the semiconductor package. This testing occurs after the semiconductor package has been separated from a matrix of semiconductor packages by singulation.

Conventionally, in a molded leadless package (MLP), the features of a semiconductor chip are connected to the leads of the leadframe by bond wires, for example see U.S. Pat. No. 6,475,827 issued to Lee, et al. Such bond wires are typically made of gold or aluminum with a diameter of about 25-µm and are quite fragile. Typically, bond wires have a large minimum radius of curvature at bends in the wire to avoid damage. Thus, the bond wires dictate the dimensions of the MLP, whereas the MLP may have a smaller profile without the bond wires. Further, care must be taken when over-molding the encapsulation layer as the wires may break under stress from the molding resin. The molding stress may also deform the bond wires, potentially causing short circuits.

One method for avoiding the issues with wire bonding is to affix stud bumps to the features on top of the semiconductor chip. The chip is then flipped over onto a leadframe, which includes conductors that connect the bumps with the leads. A drawback of such "flip chip" MLPs is that the leadframe must be specifically designed for the semiconductor chip applied to it. Particularly, the conductors and the leads must account for the number and the pattern of bumps on the chip. A change in the chip design, such as a higher density of features, may require a new leadframe design. Further, if different semiconductor chips are packaged on the same line, the specific leadframe for each chip must be carefully coordinated with the chips.

Therefore, what is needed is a method of manufacturing an MLP that is reliable and less expensive, while providing a leadframe that may be used for multiple semiconductor chip designs.

SUMMARY OF THE INVENTION

The invention comprises, in one form thereof, a flip chip molded leadless package (MLP) with electrical paths printed in conducting ink. The MLP includes a taped leadframe with a plurality of leads and a non-conducting tape placed thereon. The electrical paths are printed on the tape to connect the features of the semiconductor device to the leads and an encapsulation layer protects the package. In a second embodiment, the MLP includes a pre-molded leadframe with the electrical paths printed directly thereon. The present invention also provides a method of fabricating the semiconductor package according to each embodiment.

More particularly, the invention includes a packaged semiconductor device comprising a leadframe having a plurality of electrically conductive leads; a die positioned on the leadframe, the die having a plurality of stud bumps; a plurality of electrical paths between the plurality of stud bumps and the plurality of leads, wherein the electrical paths comprise electrically conductive ink; and an over-molded, non-conducting polymer. The non-conducting polymer is, for example, an encapsulating molding compound. In one form, the leadframe comprises a pre-molded frame wherein the leads are embedded in a non-conducting polymer and the electrical paths are printed directly on the pre-molded leadframe. The pre-molded leadframe may be integral with a plurality of additional leadframes during assembly. In another form, the packaged semiconductor device comprises a non-conductive tape situated on the leadframe, the tape including an edge proximate to each of the leads. The electrical paths may then be printed on the non-conductive tape. In this embodiment, the leadframe is provided on a leadframe tape having a plurality of leadframes. Each of the electrical paths connects one stud bump to one lead and the electrical paths follow distinct courses.

The invention further includes a method for packaging a semiconductor device. The method comprises the steps of providing a leadframe having a plurality of electrically conductive leads and an integrated circuit die having a plurality of electrically conductive stud bumps in a pattern on one side of the die; printing a plurality of electrical paths between the leads and a plurality of termini using an electrically conductive ink, wherein the termini are arranged according to the pattern of stud bumps; situating the die on the leadframe such that each of the stud bumps lines up with a terminus thereby connecting the stud bumps to the leads via the electrical paths; and molding the die and the leadframe in a non-conducting polymer. The non-conducting polymer is, for example, an encapsulating molding compound or an epoxy.

In one form of the method, a non-conductive tape is positioned on the leadframe and the electrical paths are subsequently printed on the tape. The non-conductive tape positioning step may comprise a tape stamping process, wherein a punching die removes the non-conductive tape from a sheet and adheres the non-conductive tape to the leadframe. Alternatively, non-conductive tape positioning step comprises a laser cutting process, wherein anon-conductive sheet is placed over the leadframe, a laser cutting tool cuts the non-conductive tape from the sheet, and the remainder of the sheet is removed.

In another form of the method, the leadframe is pre-molded with a non-polymer and the electrical paths are printed on the pre-molded leadframe. The electrical paths may be printed using a stencil printing technique. The semiconductor devices and leadframes may be provided in an array having a plurality of devices and leadframes; the leadframes are integrally connected. In this case, the method further comprises the step of separating the packages from the array. The stud bumps may be provided in a stacked configuration to increase the height of the stud bumps. The method may include the further step of applying an adhesive to the stud bumps prior to the die situating step.

An advantage of the present invention is that the MLP does not include bond wires. Further, the MLP may be used for a new die by simply changing the printing of the conductive paths—the MLP doesn't need to be redesigned and the manufacturing equipment doesn't need to be changed except to reconfigure the printer by programming or changing a stencil.

BRIEF DESCRIPTION OF THE DRAWINGS

The above-mentioned and other features and advantages of this invention, and the manner of attaining them, will become apparent and be better understood by reference to the following description of several embodiments of the invention in conjunction with the accompanying drawings, wherein:

FIG. 2 is an exploded view of the semiconductor package of FIG. 1;

FIG. 3A is a plan view of the leadframe and the non-conducting tape portions of the semiconductor package of FIG. 1;

FIG. 3B is a cross-sectional view of the leadframe and the non-conducting tape portions of the semiconductor package of FIG. 1;

FIG. 4A is a plan view of the leadframe and tape of FIG. 3A with the added electrical paths;

FIG. 4B is a cross-sectional view of the leadframe and tape of FIG. 3B with the added electrical paths;

FIG. 5A is a plan view of the leadframe and tape of FIG. 4A with the added die;

FIG. 5B is a cross-sectional view of the leadframe and tape of FIG. 4B with the added die;

FIGS. 7A-7C show the steps in a tape laser cutting process for applying the non-conducting tape to the leadframe;

FIG. 8 is a cross-sectional view of a semiconductor package according to a second embodiment of the present invention;

FIG. 10A is a plan view of the leadframe of the semiconductor package of FIG. 8;

FIG. 10B is a cross-sectional view of the leadframe of the semiconductor package of FIG. 8;

Corresponding reference characters indicate corresponding parts throughout the several views. The examples set out herein illustrate several embodiments of the invention but should not be construed as limiting the scope of the invention in any manner.

DETAILED DESCRIPTION

Figure 1:
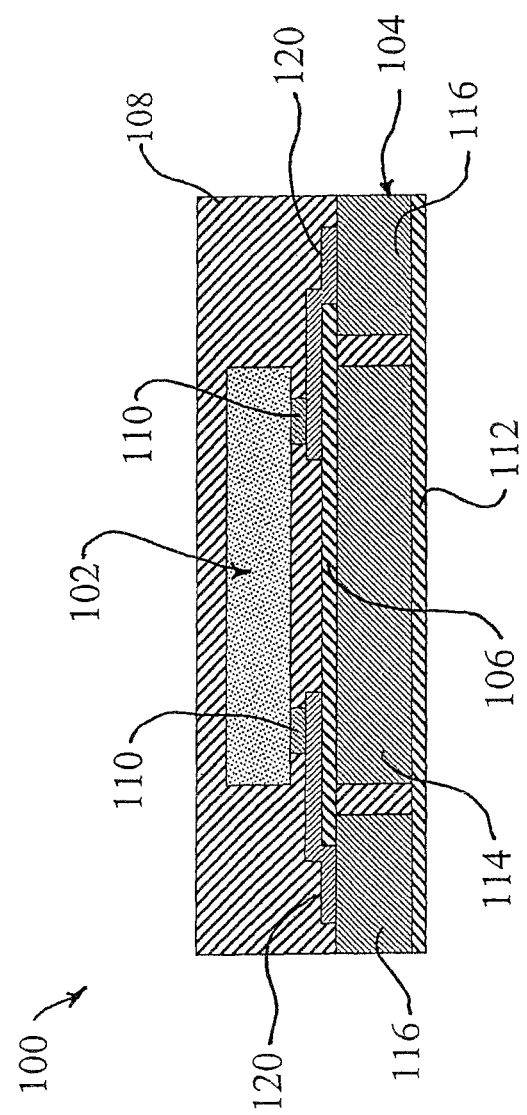
FIG. 1 is a cross-sectional view of a semiconductor package according to a first embodiment of the present invention.
Figure 6A:
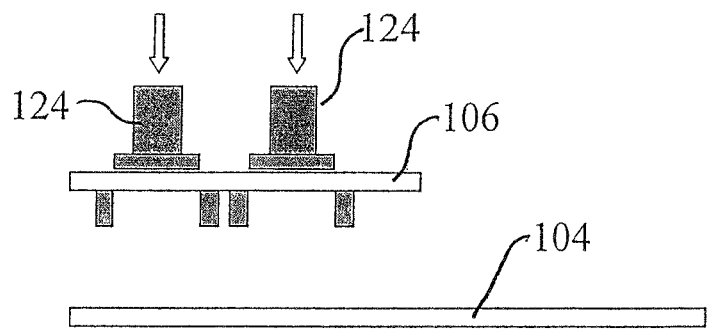
FIGS. 6A-6C show the steps in a tape stamping process for applying the non-conducting tape to the leadframe.
Figure 6B:
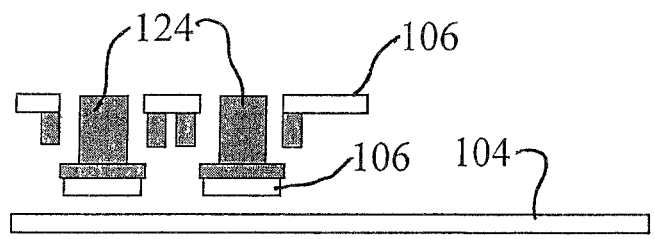
Figure 6C:
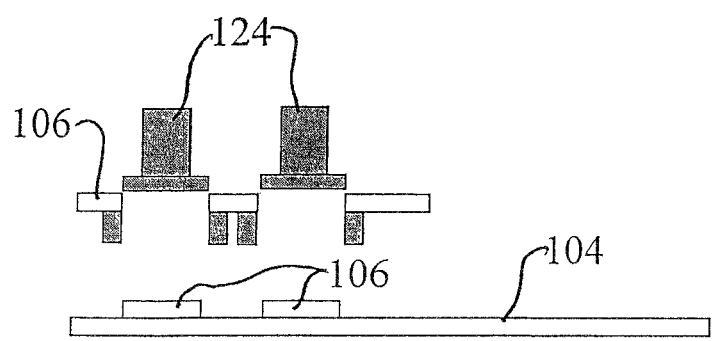

Referring to FIGS. 1 and 2, there is shown the packaged semiconductor device of the present invention. The molded leadless package (MLP) 100 includes a die 102, a leadframe 104 with non-conducting tape 106, and an encapsulation material 108. The die 102 is a semiconductor device with a plurality of conductive stud bumps 110 that provide electrical contacts for features on the semiconductor device. The stud bumps 110 are arranged in a pattern unique to the design of the semiconductor device, the pattern depending on the number and location of the integrated circuit features. For example, the stud bumps 110 may be formed on metal pads (not shown) of the semiconductor chip 102 in a method similar to wire bonding. The metal pads are electrically connected to unit elements (not shown) formed therebelow. The bumps and metal pads provide input and output terminals for connecting the chip 102 to other chips. The internal structure of the semiconductor chip 102 may vary, and accordingly does not limit the scope of the present invention. For example, the semiconductor chip 102 may include discrete power semiconductor devices (diodes, transistors, thyristors, IGBTs), linear devices, integrated circuits, and memory devices or various types of logic circuits.

The number of stud bumps 110 may depend on the number of metal pads, which may vary according to the integration density of the semiconductor chip 102. For example, as the integration density of the semiconductor chip 102 increases, the number of metal pads increase, and accordingly, the number of bumps 110 may increase. The bumps 110 may include a conductive material, such as, copper or gold. The bumps 110 may have any shape as long as it protrudes from the bottom surface of the semiconductor chip 102. In the present embodiment, the stud bumps 110 are at least 5-μm large and may be less than several hundreds of μm so as to achieve stable flip chip bonding. For example, the diameter of each of the bumps 110 may range from 10-μm to 200-μm.

The stud bumps 110 may be provided in a single configuration, as shown in the figures, or a stacked configuration. Stacking the stud bumps 110, wherein two or more studs are formed on a single metal pad, increases the space under the flip chip 102, which may relieve stress on the chip.

The leadframe 104 is a taped leadframe provided in an array, though only the leadframe for a single MLP is shown in the figures. The leadframe 104 of the present embodiment has a rectangular shape, as shown by the plan view of FIG. 3A; however, a leadframe having any shape is considered to be within the scope of the invention. The leadframe 104 includes a non-conducting backing 112, a die support 114, a lead support 116, and a plurality of leads 118 (shown in FIG. 3A). The leads 118 are conductive members that may serve as terminals that are connected to an external device. The number of leads 118 included on the leadframe 104 may depend on the number required by the design of the die 102, or a standard number of leads 118 is provided and only the number of leads required by the die 102 are utilized. A trench between the die support 114 and the lead support 116 is filled by the encapsulation material 108 to electrically isolate the supports.

The non-conducting tape 106 covers the die support 114 and a portion of the lead support 116. A plurality of electrically conductive paths 120 comprising an electrically conductive ink connects each of the stud bumps 110 to one of the leads 118. Each of the paths 120 is printed on the non-conducting tape 106 and includes an enlarged portion or terminus 122 (best shown in FIG. 4A) at the interface between the stud bump 110 and the path 120 thereby connecting each of the semiconductor device features with a lead 118.

The encapsulation material 108 is a layer of non-conducting polymer molded over the die 102 and the leadframe 104 to protect the MLP 100 from external environments. The encapsulation material 108 is, for example, an epoxy or an encapsulating molding compound (EMC).

The MLP 100 is assembled by positioning the non-conducting tape 106 on the die support 114 and the lead support 116 such that the edge of the tape 106 is proximate to or covering a portion of each of the leads 118 as shown in FIGS. 3A and 3B. In a particular embodiment, the tape 106 is adhered to the leadframe 104. As shown by FIGS. 4A and 4B, the conductive paths 120 and the termini 122 are printed onto the tape 106 and the leads 118 using any suitable printing technique, such as stencil printing. The conductive paths 120 and the termini 122 are printed such that each of the termini 122 lines up with one of the stud bumps 110 and such that the conductive paths 120 do not cross each other.

The die 102 is situated on the non-conducting tape 106 such that each of the stud bumps 110 contacts a terminus 122 as shown by FIGS. 5A and 5B. An adhesive may be applied to the stud bumps 110 prior to situating the die 102 onto the non-conducting tape 106 to retain the die 102 in position until the encapsulation layer 108 is over-molded and cured. In a particular embodiment, the adhesive is applied by dipping the stud bumps 110 into the adhesive; however care must be taken to prevent the adhesive from contacting the surface of the die 102. The stud bumps 110 having a stacked configuration simplify this process by increasing the space between the surface of the die 102 and the tip of the stud bumps 110.

A non-conducting polymer is over-molded onto the die 102 and leadframe 104 and cured to form the encapsulation layer 108, resulting in the MLP 100 shown in FIG. 1. After molding the encapsulation material 108, the MLP 100 is removed from the array by sawing or another suitable cutting method, thereby exposing the leads 118. The MLP 100 then proceeds to typical end-of-line processing such as final testing.

The non-conducting tape 106 may be applied to the leadframe 104 by a number of methods, such as, for example, by a stamping process. In the tape stamping process, a sheet of the non-conducting tape 106 is run over the array of leadframes. The leadframes 104 are aligned with a plurality of punching dies 124 that, in a downward motion, punch out portions of the tape 106 and contact them with the leadframes 104, as shown in FIGS. 5A-5C. An adhesive on the underside of the tape 106 adheres the tape 106 to the leadframes 104, resulting in the leadframe and tape assembly shown in FIGS. 3A and 3B. In a further example, the tape 106 is applied using a laser cutting process. In this process, a sheet of the non-conducting tape 106 is applied to the array of leadframes and portions of the tape 106 are cut using a laser or other tool as shown for a single leadframe 104 in FIGS. 7A and 7B. The unwanted tape is removed leaving the non-conducting tape 106 on the leadframe 104, as shown in FIG. 7C.

Figure 9:
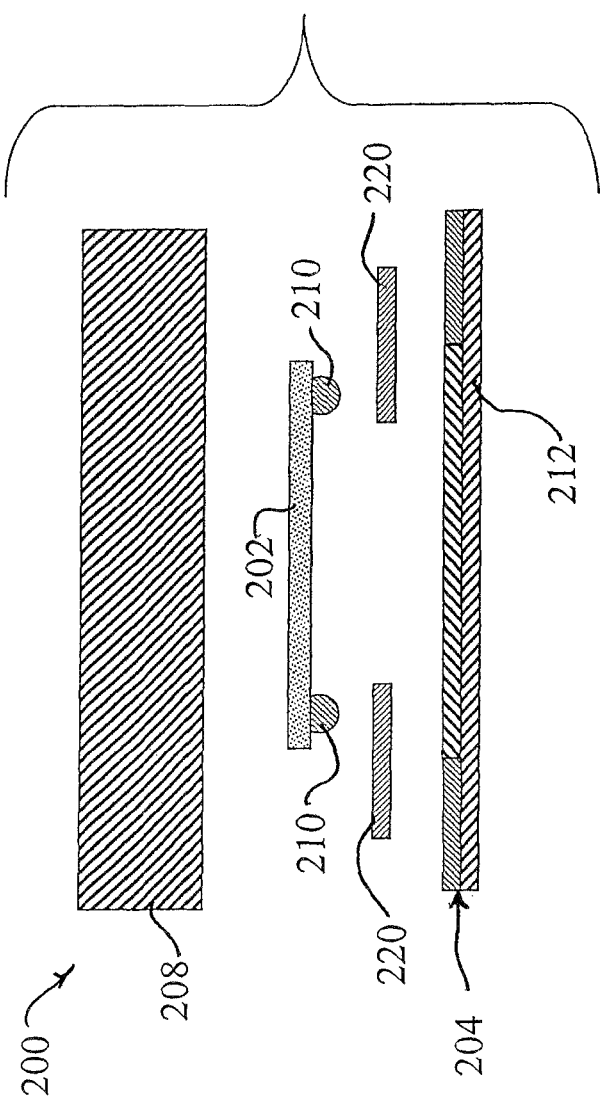
FIG. 9 is an exploded view of the semiconductor package of FIG. 8.

In a second embodiment shown in FIGS. 8 and 9, the MLP includes a pre-molded leadframe. The MLP 200 comprises a die 202, a pre-molded leadframe 204, and an encapsulation material 208. Similarly to the die 102, the die 202 is a semiconductor device with a plurality of conductive stud bumps 210 that provide electrical contacts for features on the semiconductor device.

The non-conducting backing 212 and the leads 218 (shown in FIG. 10A) of the pre-molded leadframe 204 are molded with a non-conducting polymer such as an epoxy or an EMC to form a uniform surface onto which the conducting paths 220 may be printed. Thus, no non-conducting tape is needed for this embodiment. Similarly to the leadframe 104, the pre-molded leadframe 204 is provided in an array, though only the leadframe for a single MLP is shown in the figures. The pre-molded leadframe 204 of the present embodiment has a rectangular shape, as shown by the plan view of FIG. 3A; however, a leadframe having any shape is considered to be within the scope of the invention. The leads 218 are conductive members that may serve as terminals that are connected to an external device. The number of leads 218 included on the pre-molded leadframe 204 may depend on the number required by the design of the die 202, or a standard number of leads 218 is provided and only the number of leads required by the die 202 are utilized.

A plurality of electrically conductive paths 220 comprising an electrically conductive ink connects each of the stud bumps 210 to one of the leads 218. Each of the paths 220 is printed on the pre-molded leadframe 204 and includes an enlarged portion or terminus 222 (best shown in FIG. 11A) at the interface between the stud bump 210 and the path 220 thereby connecting each of the semiconductor device features with a lead 218.

The encapsulation material 208 is a layer of non-conducting polymer molded over the die 202 and the pre-molded leadframe 204 to protect the MLP 200 from external environments. The encapsulation material 208 is, for example, an epoxy or an EMC.

Figure 11B:
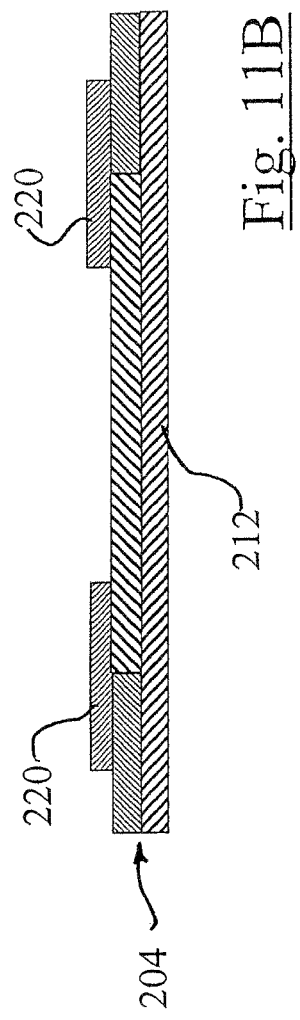
FIG. 11B is a cross-sectional view of the leadframe of FIG. 10B with the added electrical paths.
Figure 11A:
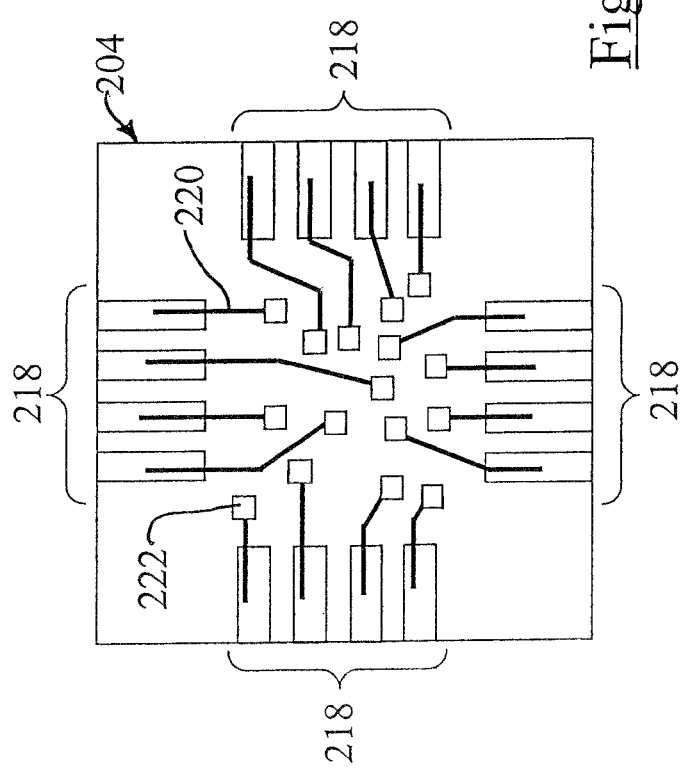
FIG. 11A is a plan view of the leadframe of FIG. 10A with the added electrical paths.

The MLP 200 is assembled by molding the pre-molded leadframe 204 such that the top surfaces of the leads 218 are exposed as shown in FIGS. 10A and 10B. As shown by FIGS. 11A and 11B, the conductive paths 220 and the termini 222 are printed onto the pre-molded leadframe 204 and the leads 218 using any suitable printing technique, such as stencil printing. The conductive paths 220 and the termini 222 are printed such that each of the termini 222 lines up with one of the stud bumps 210 and such that the conductive paths 220 do not cross each other.

Figure 12A:
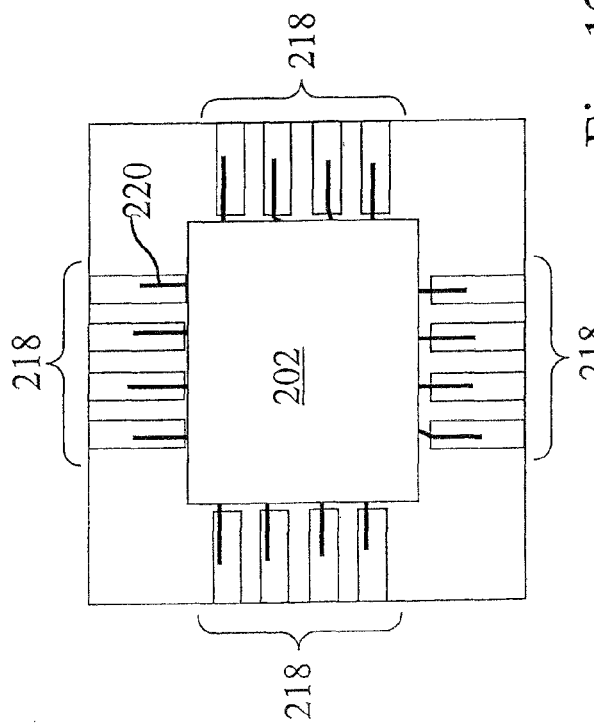
FIG. 12A is a plan view of the leadframe of FIG. 11A with the added die.
Figure 12B:
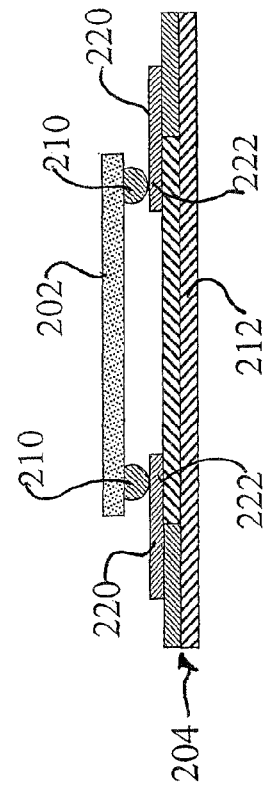
FIG. 12B is a cross-sectional view of the leadframe of FIG. 11B with the added die.

The die 202 is situated on the pre-molded leadframe 204 such that each of the stud bumps 210 contacts a terminus 222 as shown by FIGS. 12A and 12B. An adhesive may be applied to the stud bumps 210 prior to situating the die 202 onto the pre-molded leadframe 204 to retain the die 202 in position until the encapsulation layer 208 is over-molded and cured. A non-conducting polymer is over-molded onto the die 202 and pre-molded leadframe 204 and cured to form the encapsulation layer 208, resulting in the MLP 200 shown in FIG. 8. After molding the encapsulation material 208, the MLP 200 is removed from the array by sawing or another suitable cutting method, thereby exposing the leads 218. The MLP 200 then proceeds to typical end-of-line processing such as final testing.

It should be noted that the thicknesses of layers and regions are exaggerated in the drawings for clarity.

While the invention has been described with reference to preferred embodiments, it will be understood by those skilled in the art that various changes may be made and equivalents may be substituted for elements thereof to adapt to particular situations without departing from the scope of the invention. Therefore, it is intended that the invention not be limited to the particular embodiments disclosed as the best mode contemplated for carrying out this invention, but that the invention will include all embodiments falling within the scope and spirit of the appended claims.

LIST OF REFERENCE NUMBERS

100 . . . molded leadless package (MLP)
102 . . . die
104 . . . leadframe
106 . . . non-conducting tape
108 . . . encapsulation material
110 . . . stud bumps
112 . . . backing
114 . . . die support
116 . . . lead support
118 . . . plurality of leads
120 . . . electrically conductive paths
122 . . . terminus (termini)
124 . . . punching dies
200 . . . molded leadless package (MLP) of the second embodiment
202 . . . die
204 . . . leadframe
208 . . . encapsulation material
210 . . . stud bumps
212 . . . backing
218 . . . plurality of leads
220 . . . electrically conductive paths
222 . . . terminus (termini)

The invention claimed is:

1. A packaged semiconductor device, comprising:
a planar leadframe embedded in a non-conducting polymer having a plurality of electrically conductive leads but without a die support, said non-conducting polymer having a plurality of termini disposed in a pattern corresponding to a pattern of contacts on a surface of a die;
wherein an upper surface of the non-conducting polymer is in the same plane as an upper surface of the plurality of leads forming a uniform surface;
a die positioned on top of the non-conducting polymer, the die having a plurality of stud bumps disposed in a pattern corresponding to the pattern of termini on the non-conducting polymer so that the stud bumps on the die are in contact with the corresponding termini on the non-conducting polymer;
a plurality of electrical paths between the plurality of termini and the plurality of leads on the uniform surface, wherein the electrical paths comprise electrically conductive ink; and
an over-molded, non-conducting polymer encapsulating the die.

2. The packaged semiconductor device of claim 1 wherein said plurality of electrical paths are not symmetric about any plane orthogonal to the upper surface of said lead frame.

3. The packaged semiconductor device of claim 1, wherein the electrical paths are printed on the non-conducting polymer.

4. The packaged semiconductor device of claim 1, wherein the leadframe is provided on a leadframe tape having a plurality of leadframes.

5. The packaged semiconductor device of claim 1, wherein each electrical path connects one stud bump to one lead, and wherein the electrical paths follow distinct courses.

6. The packaged semiconductor device of claim 1, wherein said plurality of electrical paths are not symmetric about any plane orthogonal to the upper surface of said non-conducting polymer.

7. The packaged semiconductor device of claim 1, wherein at least one stud bump is at least 5-μm in diameter.

8. The packaged semiconductor device of claim 7, wherein at least one stud bump is between 10-μm and 200-μm in diameter.

* * * * *